(12) United States Patent
Lo et al.

(10) Patent No.: US 11,553,585 B2
(45) Date of Patent: Jan. 10, 2023

(54) CIRCUIT BOARD AND ELECTRONIC APPARATUS USING THE SAME

(71) Applicant: REALTEK SEMICONDUCTOR CORP., Hsinchu (TW)

(72) Inventors: Chin-Yuan Lo, Hsinchu (TW); Nan-Chin Chuang, Hsinchu (TW); Hsin-Hui Lo, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/563,326

(22) Filed: Dec. 28, 2021

(65) Prior Publication Data
US 2022/0312579 A1    Sep. 29, 2022

(30) Foreign Application Priority Data

Mar. 23, 2021   (TW) .................................. 110110327

(51) Int. Cl.
*H05K 1/02* (2006.01)
(52) U.S. Cl.
CPC ......... *H05K 1/0219* (2013.01); *H05K 1/0224* (2013.01); *H05K 2201/10689* (2013.01)

(58) Field of Classification Search
CPC ...... H05K 1/0219; H05K 1/224; H05K 1/225; H05K 1/227
See application file for complete search history.

(56) References Cited

FOREIGN PATENT DOCUMENTS

TW        I605734 B      11/2017

*Primary Examiner* — Jeremy C Norris
(74) *Attorney, Agent, or Firm* — Li & Cai Intellectual Property (USA) Office (57) ABSTRACT

A circuit board and an electronic apparatus using the same are provided. The circuit board includes an integrated-circuit (IC) device arrangement region and an electronic device arrangement region. The circuit board includes a first external wiring layer and an inner wiring layer. The first external wiring layer includes a plurality of first signal traces and a ground extending portion that extend from the IC device arrangement region to the electronic device arrangement region. The inner wiring layer includes a ground portion and an inner signal trace. The ground portion defines an opening region, and the inner signal trace is located in the opening region and extends from a position under the IC device arrangement region to another position under the electronic device region. The ground extending portion and the opening region overlap with each other in a thickness direction of the circuit board.

20 Claims, 7 Drawing Sheets

CIRCUIT BOARD AND ELECTRONIC APPARATUS USING THE SAME

CROSS-REFERENCE TO RELATED PATENT APPLICATION

This application claims the benefit of priority to Taiwan Patent Application No. 110110327, filed on Mar. 23, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a circuit board and an electronic apparatus using the same, and more particularly to a circuit board for high-speed transmission of signals and an electronic apparatus using the same.

BACKGROUND OF THE DISCLOSURE

In a conventional electronic product, an integrated-circuit package component, such as a system-level integration (SLI) chip, is disposed on a printed circuit board and electrically connected to other electronic components, such as a memory, through the printed circuit board. In a conventional technology, the printed circuit board usually includes four conductive layers. Two of the conductive layers are embedded in the printed circuit board and respectively serve as a power plane and a ground plane, and the other two of the conductive layers located at the outside of the printed circuit board are used to establish electrical connections among the integrated-circuit package component and the electronic components.

Specifically, the conductive layers located at the outside of the circuit board each include a plurality of signal traces and a plurality of ground traces, so that signals can be transmitted between the integrated-circuit package component and any one of the electronic components. In order to reduce a signal crosstalk and maintain signal integrity, one of the conventional means is for the signal and ground traces to be arranged to follow a ground-signal-signal-ground (GSSG) configuration.

As electronic products are developed toward being lightweight and compact, a size of the printed circuit board needs to be further reduced. However, in the conventional technique, as the size of the printed circuit board is reduced, a quantity of the ground traces has to be decreased. As such, the crosstalk between any two adjacent ones of the signal traces becomes more severe. In order to attenuate the crosstalk between any two adjacent ones of the signal traces and satisfy requirements for a signal transmission, it is necessary to either enlarge a space between any two adjacent ones of the signal traces or increase a quantity of the conductive layers in the printed circuit board.

However, enlarging the space between any two adjacent ones of the signal traces may result in an increase in an area occupied by the printed circuit board in order to accommodate for the arrangement of the signal and ground traces. Furthermore, if the quantity of the conductive layers is increased, not only the size of the circuit board, but also the fabrication cost of the circuit board would have to be increased. Accordingly, how the area or the size of the circuit board can be reduced, while reducing the crosstalk among the signal traces so that a signal transmission quality of the electronic device can satisfy requirements, is still one of the issues to be solved in the relevant industry.

SUMMARY OF THE DISCLOSURE

In response to the above-referenced technical inadequacies, the present disclosure provides a circuit board and an electronic apparatus using the same, such that a size of the circuit board can be reduced, while maintaining a signal transmission quality at a certain level, which allows the electronic apparatus to transmit signals at a higher speed.

In one aspect, the present disclosure provides a circuit board having an integrated-circuit (IC) device arrangement region and an electronic device arrangement region defined thereon. The circuit board includes a first external wiring layer and an inner wiring layer. The first external wiring layer includes a plurality of first signal traces and at least one ground extending portion that extend from the IC device arrangement region to the electronic device arrangement region. The inner wiring layer includes a ground portion and at least one inner signal trace. The ground portion has an opening region, and the inner signal trace is located in the opening region and extends from a position under the IC device arrangement region to another position under the electronic device arrangement region. The ground extending portion and the opening region overlap with each other in a thickness direction of the circuit board.

In yet another aspect, the present disclosure provides an electronic apparatus including the abovementioned circuit board, an integrated-circuit (IC) device, and an electronic device. The IC device is disposed on the circuit board and located at the IC device arrangement region. The electronic device is disposed on the circuit board and located at the electronic device arrangement region. The electronic device is electrically connected to the IC device through the circuit board.

Therefore, in the circuit board and the electronic apparatus provided by the present disclosure, by virtue of "the first external wiring layer including a plurality of first signal traces and at least one ground extending portion" and "an inner wiring layer including a ground portion and at least one inner signal trace, in which the ground portion has an opening region, and the inner signal trace is located in the opening region," and "the ground extending portion and the opening region overlapping with each other in a thickness direction of the circuit board," the size of the circuit board can be reduced, while maintaining a signal transmission quality of the electronic apparatus at a certain level.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
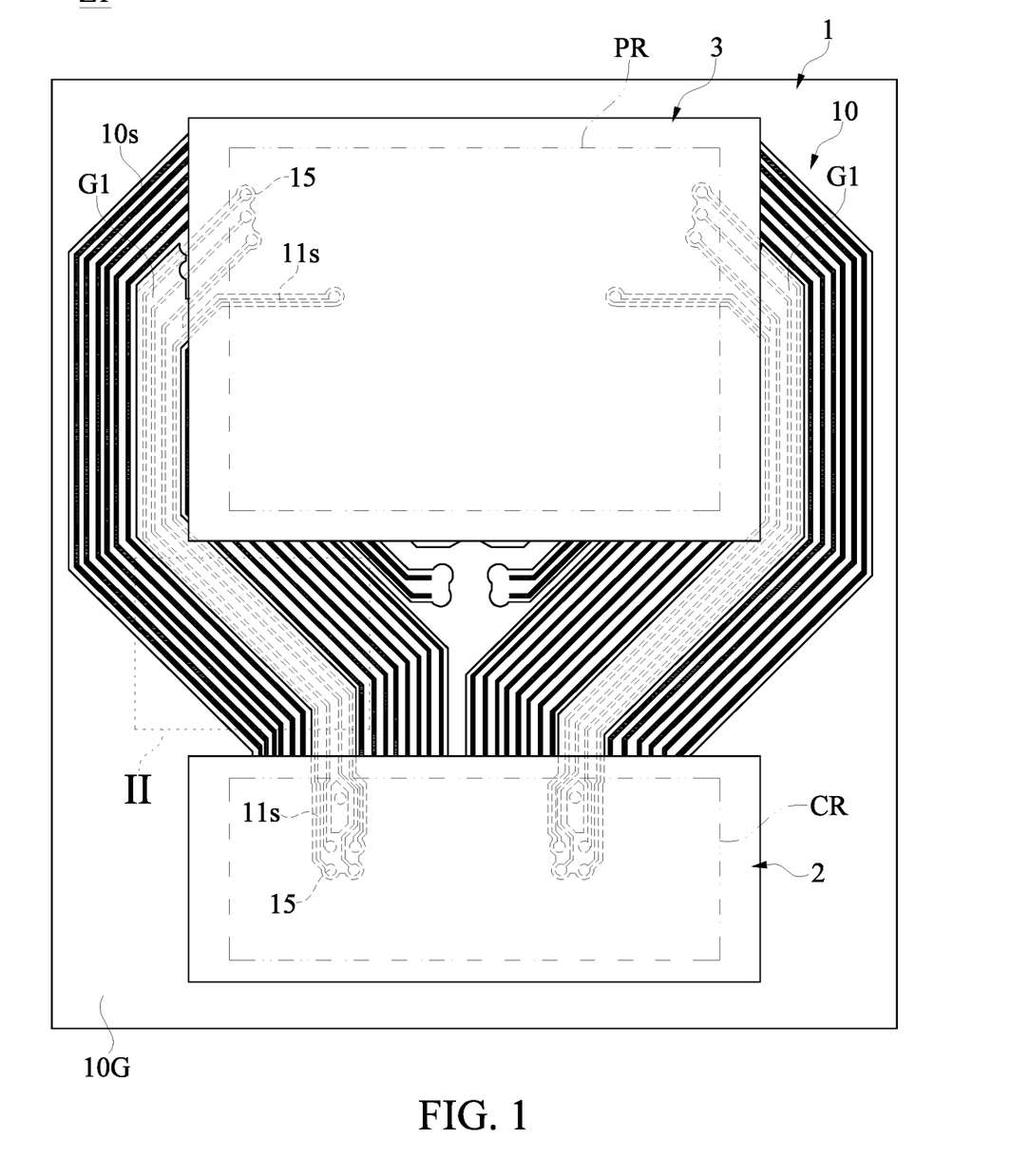
FIG. 1 is a partial schematic top view of an electronic apparatus according to a first embodiment of the present disclosure.

Reference is made to FIG. 1, which is a partial schematic top view of an electronic apparatus according to a first embodiment of the present disclosure. In the embodiment of the present disclosure, an electronic apparatus Z1 includes a circuit board 1, an integrated-circuit (IC) device 2, and an electronic device 3.

The IC device 2 is, for example, a central processing unit (CPU), or a graphic processing unit (GPU), which can be a system-on-chip (SoC) package structure. Furthermore, the IC device 2 can be adapted to transmit signals at high speed, such as at a speed of 4000 Mb per second.

The electronic device 3 is, for example, a memory, a passive element, or a discrete component, and the present disclosure is not limited thereto. The memory can be, for example, a dynamic random access memory, a flash memory, and so on. The passive element can be, for example, a resistor, a capacitor, or an inductor, and the discrete component can be, for example, a transistor or a diode, but the present disclosure is not limited the examples provided herein. FIG. 1 illustrates only one electronic device 3, but a number and a type of the electronic device 3 are not limited. In another embodiment, more electronic devices 3 can be used.

As shown in FIG. 1, the circuit board 1 of the instant embodiment has an integrated-circuit (IC) device arrangement region CR and an electronic device arrangement region PR. The IC device 2 and the electronic device 3 are both disposed on the circuit board 1 and located at the IC device arrangement region CR and the electronic device arrangement region PR, respectively. The IC device 2 and the electronic device 3 can be electrically connected to each other through the circuit board 1 so as to transmit signals therebetween. In one embodiment, the IC device 2 and the electronic device 3 transmit signals at a relatively higher transmission speed, for example, at a speed higher than 4000 Mb per second. Accordingly, the circuit board 1 provided in the embodiment of the present disclosure not only has a smaller size, but also can be used to attenuate signal crosstalk during the IC device 2 transmitting signals at a higher transmission speed.

Figure 2:
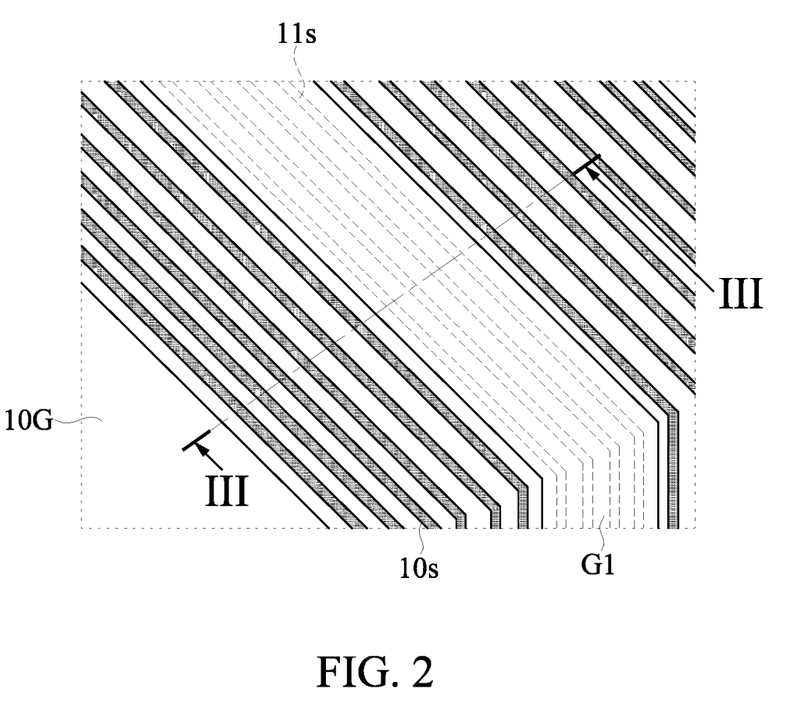
FIG. 2 is an enlarged view of part I of a circuit board shown in FIG. 1.
Figure 3:
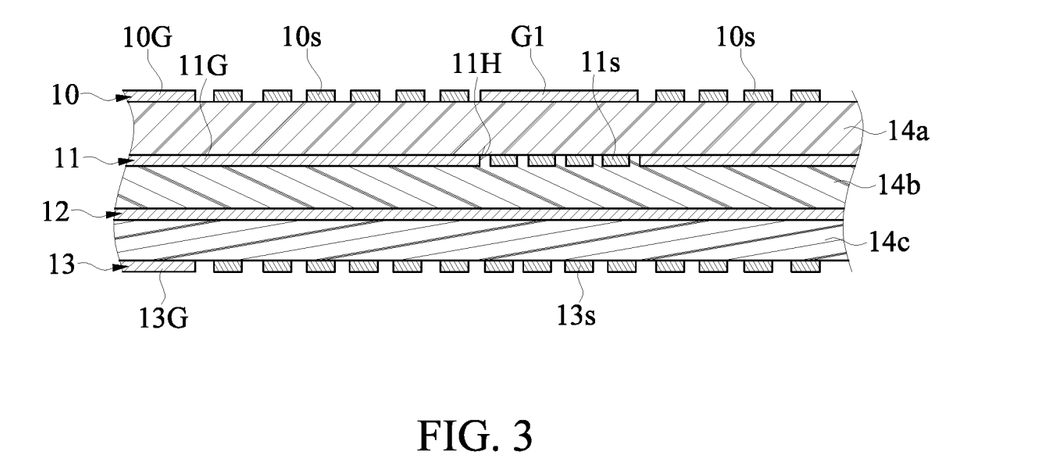
FIG. 3 is a cross-sectional view taken along line III-III of FIG. 2.

Reference is made to FIG. 1 to FIG. 3, in which FIG. 2 is an enlarged view of part I of a circuit board shown in FIG. 1, and FIG. 3 is a cross-sectional view taken along line III-III of FIG. 2. The circuit board 1 includes a first external wiring layer 10, an inner wiring layer 11, a power conductive layer 12, and a second external wiring layer 13.

The first external wiring layer 10, the inner wiring layer 11, the power conductive layer 12, and the second external wiring layer 13 are spaced apart from one another in a vertical direction. Specifically, as shown in FIG. 3, the circuit board 1 of the embodiment in the present disclosure further includes a plurality of insulating layers 14a-14c, and any two adjacent ones of the first external wiring layer 10, the inner wiring layer 11, the power conductive layer 12, and the second external wiring layer 13 are spaced apart from each other by one of the insulating layers 14a-14c. Furthermore, the first external wiring layer 10 and the second external wiring layer 13 are respectively located at two opposite sides of the circuit board 1. The inner wiring layer 11 and the power conductive layer 12 are embedded in the circuit board 1, and are both disposed between the first and second external wiring layers 10, 13.

Reference is made to FIG. 1 and FIG. 2. The first external wiring layer 10 includes a plurality of first signal traces 10s and at least one ground extending portion G1 (two ground extending portions G1 are exemplarily illustrated in FIG. 1). It should be noted that a pattern of the first external wiring layer 10 has been simplified for ease of illustration. That is to say, a circuit layout of the first external wiring layer 10, for example, quantities and positions of the first signal traces 10s and the ground extending portions G1, can be adjusted according to particular implementations, and are not limited in the present disclosure.

The first signal traces 10s can extend from the IC device arrangement region CR to the electronic device arrangement region PR. For example, the first external wiring layer 10 can include a plurality of pads (not illustrated in figures) arranged in the IC device arrangement region CR and in the electronic device arrangement region PR. Each of the first signal traces 10s can extend from one of the pads in the IC device arrangement region CR to another one of the pads in the electronic device arrangement region PR. When the IC device 2 and the electronic device 3 are respectively arranged in the IC device arrangement region CR and the electronic device arrangement region PR through the pads, the IC device 2 and the electronic device 3 can transmit signals to each other through the first signal traces 10s.

As shown in FIG. 1, the at least one ground extending portion G1 extends from the IC device arrangement region CR to the electronic device arrangement region PR. Reference is made to FIG. 2. The at least one ground extending portion G1 has a width greater than a line width of each one of the plurality of first signal traces 10s. It is worth mentioning that the ground extending portion G1 in the instant embodiment does not have any conductive via formed therein. That is to say, the ground extending portion G1 of the instant embodiment is a "via-free" ground trace. In one embodiment, the ground extending portion G1 can be electrically grounded through one of ground terminals of the IC device 2 or the electronic device 3, and the present disclosure is not limited thereto.

The plurality of first signal traces 10s can be divided into at least two groups by the ground extending portion G1, and the ground extending portion G1 is located between the two groups. Furthermore, the quantities of the first signal traces 10s respectively in the two groups can be the same or different, and the present disclosure is not limited thereto. When the first external wiring layer 10 includes more ground extending portions G1, the first signal traces 10s can be divided into more than two groups, and each one of the ground extending portions G1 can be located between any two adjacent ones of the groups.

As shown in FIG. 1, the first external wiring layer 10 of the instant embodiment includes two ground extending portions G1, such that the plurality of first signal traces 10s are divided into three groups, but the present disclosure is not limited thereto. Furthermore, the first external wiring layer 10 includes a first ground region 10G, and the first ground region 10G surrounds the IC device arrangement region CR, the electronic device arrangement region PR, the plurality of first signal traces 10s, and the two ground extending portions G1. Accordingly, the first ground region 10G has an area greater than that of each of the ground extending portions G1.

For example, a portion of the plurality of first signal traces 10s that are located between the first ground region 10G and a left one of the ground extending portions G1 belong to a first group, another portion of the plurality of first signal traces 10s that are located between the two ground extending portions G1 belong to a second group, and yet another portion of the plurality of first signal traces 10s that are located between a right one of the ground extending portions G1 and the first ground region 10G belong to a third group. As shown in FIG. 1, it is worth mentioning that in one of the groups (such as in the first or third group), there is no ground trace arranged between any two adjacent ones of the first signal traces 10s. During an information transmission between the IC device 2 and the electronic device 3, a noise signal generated on the first signal traces 10s can be coupled to a nearer one of the first ground region 10G or the first ground extending portion G1, and can then be removed. However, in another embodiment, the first external wiring layer 10 can also include a ground trace arranged between two adjacent ones of the first signal traces 10s, so that the signal crosstalk can be further reduced.

Figure 4:
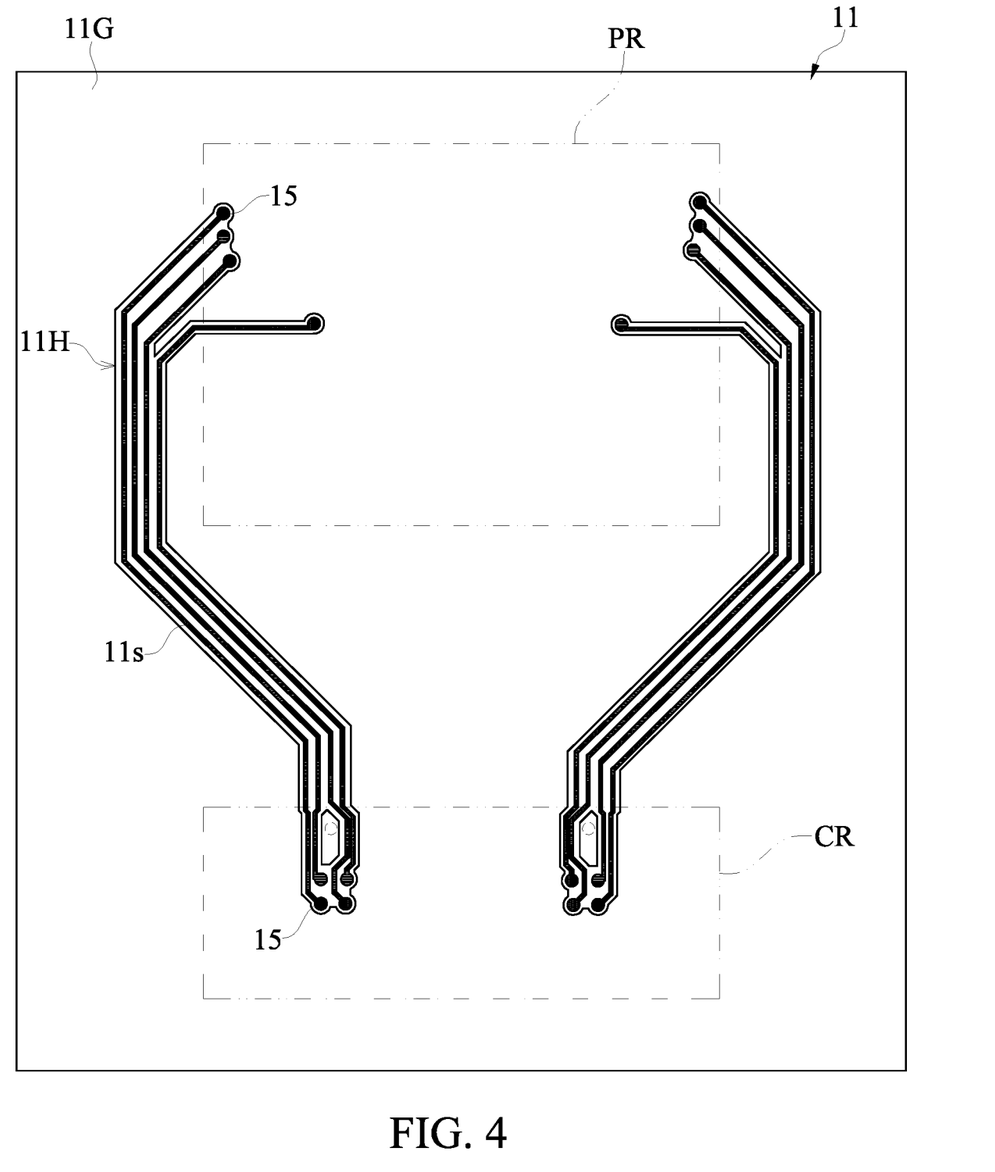
FIG. 4 is a partial schematic top view of an inner wiring layer according to the first embodiment of the present disclosure.

Reference is made to FIG. 3 and FIG. 4, in which FIG. 4 is a partial schematic top view of an inner wiring layer according to the first embodiment of the present disclosure. The inner wiring layer 11 includes a ground portion 11G and at least one inner signal trace 11s (a plurality of inner signal traces 11s are exemplarily illustrated in FIG. 3 and FIG. 4).

As shown in FIG. 3, the ground portion 11G overlaps with the plurality of first signal traces 10s in a thickness direction of the circuit board 1 so as to shield the plurality of first signal traces 10s and reduce the signal crosstalk. It should be noted that a conductive layer embedded in a conventional circuit board is usually a complete ground plane and does not have any signal trace. Compared to the conventional circuit board, in the embodiment of the present disclosure, at least one opening region 11H (two of which are exemplarily illustrated in FIG. 4) is defined by the ground portion 11G. The opening region 11H extends from a position under the IC device arrangement region CR to another position under the electronic device arrangement region PR, so that the at least one inner signal trace 11s can be arranged in the opening region 11H.

The inner signal traces 11s can be disposed to transmit signals between the IC device 2 and the electronic device 3. As shown in FIG. 3 and FIG. 4, the inner signal traces 11s are disposed in the opening region 11H, and each of the inner signal traces 11s extends from a position under the IC device arrangement region CR to another position under the electronic device arrangement region PR.

Reference is made to FIG. 4, which is to be read in conjunction with FIG. 1. The circuit board 1 of the instant embodiment can further include a plurality of signal conductive posts 15. Each of the signal conductive posts 15 extends downwardly from the first external wiring layer 10 to the inner wiring layer 11, and is connected to the corresponding inner signal trace 11s. Specifically, each of the inner signal traces 11s is connected to two of signal conductive posts 15, one of which is located in the IC device arrangement region CR, and the other one of which is located in the electronic device arrangement region PR. The two signal conductive posts 15 pass through at least one of the insulating layers 14a-14c and are respectively connected to two opposite end portions of the corresponding inner signal trace 11s. In one embodiment, one of the signal conductive posts 15 passes through all the insulating layers 14a-14c and extends to the second external wiring layer 13, but the present disclosure is not limited thereto. In another embodiment, one of the signal conductive posts 15 extends from the first external wiring layer 10 to the inner wiring layer 11 and does not extend downward to the second external wiring layer 13.

As shown in FIG. 3, it is worth mentioning that the opening region 11H corresponds in position to the ground extending portion G1 of the first external wiring layer 10. The ground extending portion G1 and the opening region 11G corresponding thereto overlap with each other in the thickness direction of the circuit board 1. In the instant embodiment, the width of the ground extending portion G1 is equal to or greater than a width of the opening region 11H. Accordingly, in the thickness direction of the circuit board 1, the ground extending portion G1 also overlaps with the inner signal trace(s) 11s arranged in the opening region 11H, thereby shielding the inner signal trace(s) under the ground extending portion G1. In the instant embodiment, the width of the ground extending portion G1 is greater than a line width of each of the inner signal traces 11s.

It is worth mentioning that in the instant embodiment, there is no ground trace disposed between any two adjacent ones of the inner signal traces 11s arranged in the same opening region 11. However, in another embodiment, based on a practical simulation result, at least one inner ground trace electrically connected to the ground portion 11G can be arranged between two adjacent ones of the inner signal traces 11s arranged in the same opening region 11 so as to further attenuate the signal crosstalk between the inner signal traces 11s.

Accordingly, in the electronic apparatus Z1 of the embodiment in the present disclosure, by embedding a portion of the signal traces, i.e., the inner signal traces 11s, inside of the circuit board 1, the size of the circuit board 1 can be further reduced. In addition, a portion of the plurality of first signal traces 11s can be isolated from another portion of the plurality of first signal traces 11s by corresponding one of the ground extending portions G1, so as to reduce signal interference. Accordingly, not only does the circuit board 1 provided in the embodiment of the present disclosure have a smaller size, but the signal crosstalk can also be attenuated during the circuit board 1 operating in conjunction with the IC device 2 and the electronic device 3, such that the electronic apparatus Z1 has a better signal transmission quality.

Reference is made to FIG. 3. The second external wiring layer 13 includes a second ground region 13G and a plurality of second signal traces 13s. Similarly to the first signal traces 10s, each of the second signal traces 13s extend from a position under the IC device arrangement region CR to another position under the electronic device arrangement region PR. The second signal traces 13s are electrically connected to the IC device 2 and the electronic device 3 through a plurality of conductive posts. It should be noted that it is not necessary for the second signal traces 13s to be arranged at positions corresponding to the first signal traces 10s or corresponding to the inner signal traces 11s, and positions of the second signal traces 13s can be adjusted depending on particular requirements.

The power conductive layer 12 is disposed between the inner wiring layer 11 and the second external wiring layer 13. When the IC device 2 and the electronic device 3 are disposed on the circuit board 1, the power conductive layer 12 can be electrically connected to the IC device 2 and the electronic device 3 through the power traces (not illustrated in the figures) configured in the circuit board 1. In the instant embodiment, the power conductive layer 12 does not have any signal trace. Since the power conductive layer 12 is disposed between the inner wiring layer 11 and the second external wiring layer 13, the power conductive layer 12 can prevent the signal crosstalk between the inner signal traces 11s and the second signal traces 13s. However, the aforementioned description for the first embodiment is merely an example, and is not meant to limit the scope of the present disclosure.

Second Embodiment

Figure 5:
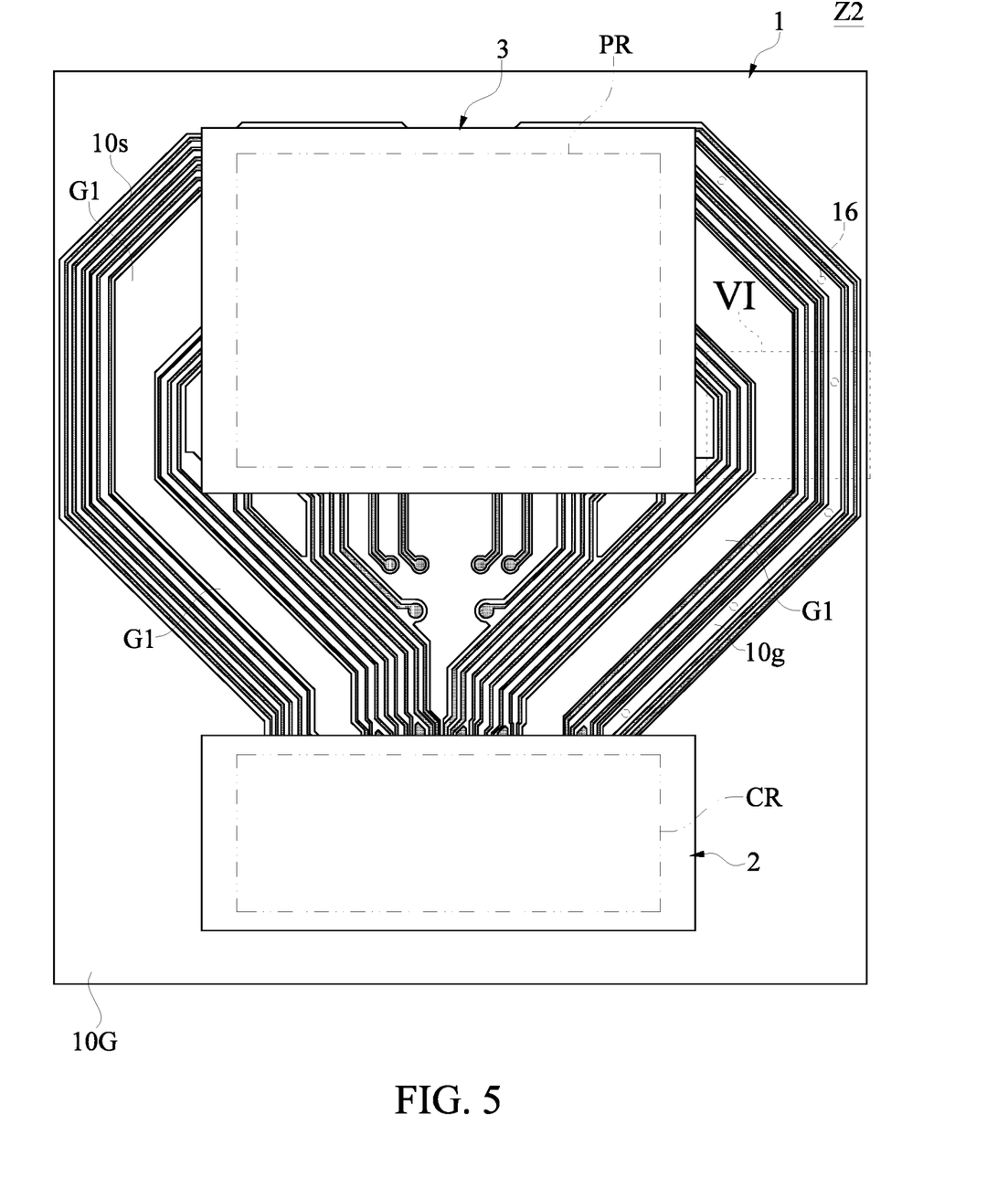
FIG. 5 is a partial schematic top view of an electronic apparatus according to a second embodiment of the present disclosure.
Figure 6:
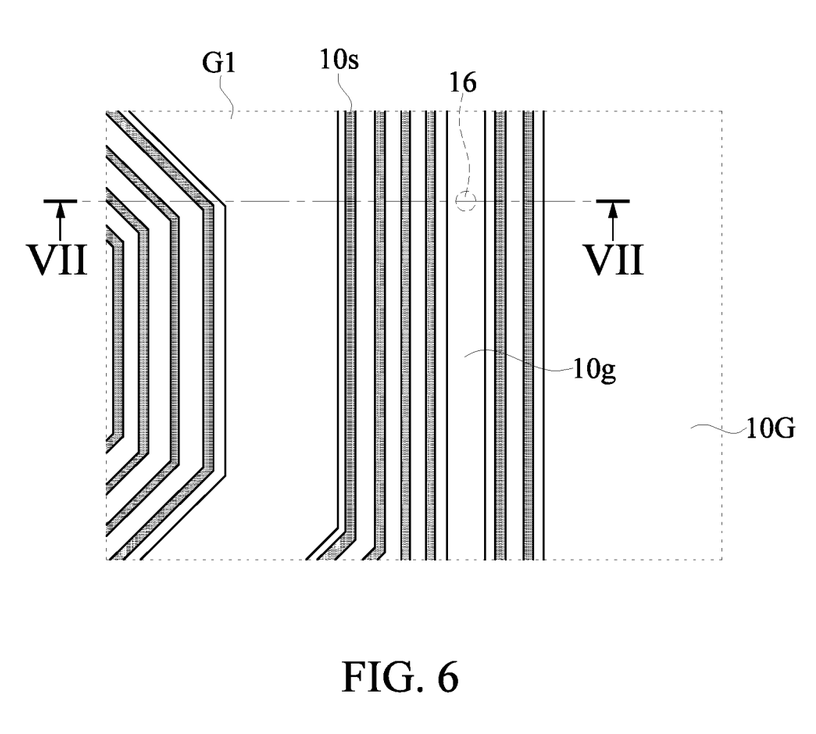
FIG. 6 is an enlarged view of part VI of a circuit board shown in FIG. 5.
Figure 7:
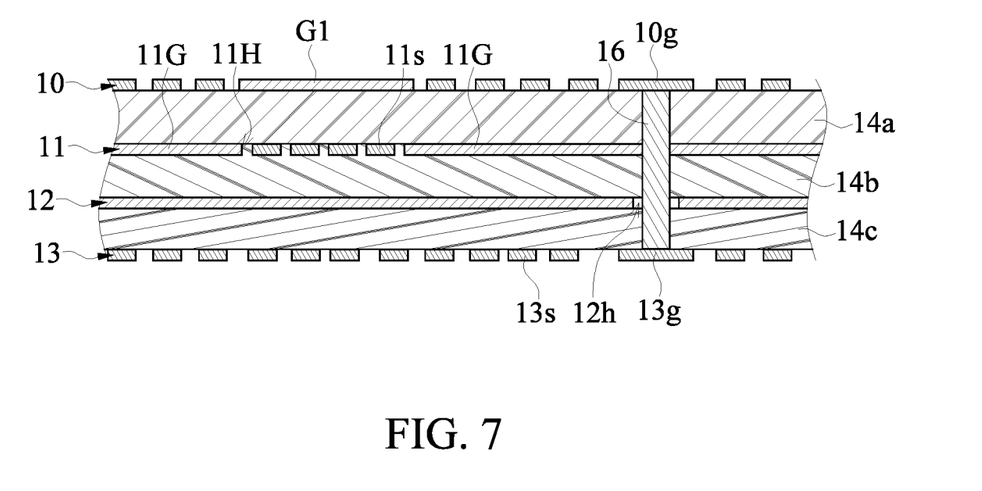
FIG. 7 is a cross-sectional view taken along line VII-VII of FIG. 6.

Reference is made to FIG. 5 to FIG. 7. FIG. 5 is a partial schematic top view of an electronic apparatus according to a second embodiment of the present disclosure. FIG. 6 is an enlarged view of part VI of a circuit board shown in FIG. 5, and FIG. 7 is a cross-sectional view taken along line VII-VII of FIG. 6. The elements of an electronic apparatus Z2 in the instant embodiment the same as or similar to those of the electronic apparatus Z1 in the first embodiment are denoted by the same or similar reference numerals, and will not be reiterated herein.

In the instant embodiment, the first external wiring layer 10 further includes at least one first ground trace 10g. The first ground trace 10g is arranged next to the first signal traces 10s and extends from the IC device arrangement region CR to the electronic device arrangement region PR. As shown in FIG. 5, one or more of the plurality of first signal traces 10s are located between the ground extending portion G1 and the first ground trace 10g. Furthermore, as shown in FIG. 5 and FIG. 6, a width of the ground extending portion G1 is greater than a line width of the first ground trace 10g.

Reference is made to FIG. 7. The first ground trace 10g and the ground portion 11G of the inner wiring layer 11 overlap with each other in the thickness direction of the circuit board 1, but the first ground trace 10g does not overlap with the opening region 11H in the thickness direction. In the instant embodiment, the width of the ground extending portion G1 is greater than the width of the opening region 11H so as to shield the inner signal traces 11s arranged in the opening region 11H.

Furthermore, as shown in FIG. 5, the circuit board 1 further includes a plurality of ground conductive posts 16, and the ground conductive posts 16 are arranged to be physically connected to different positions of the first ground trace 10g. Reference is made to FIG. 5 and FIG. 7. Specifically, each of the ground conductive posts 16 extends from the first ground trace 10g to the ground portion 11G of the inner wiring layer 11, such that the first ground trace 10g is electrically connected to the ground portion 11G. In the instant embodiment, each of the ground conductive posts 16 extends downward from the inner wiring layer 11 to the second external wiring layer 13.

Specifically, the second external wiring layer 13 includes at least one second ground trace 13g. The ground conductive posts 16 can extend from the ground portion 11G to the second ground trace 13g, so that the second ground trace 13g is electrically connected to the ground portion 11G of the inner wiring layer 11.

Furthermore, in the instant embodiment, the power conductive layer 12 further has a plurality of insulating holes 12h that respectively correspond in position to the ground conductive posts 16. To be more specific, each of the ground conductive posts 16 passes through corresponding one of the insulating holes 12h and is insulated from the power conductive layer 12. In one embodiment, the insulating holes 12h can be filled with an insulating material so as to isolate each of the ground conductive posts from the power conductive layer 12.

It is worth mentioning that compared to the first embodiment, the circuit board 1 provided in the instant embodiment of the present disclosure and including the first ground trace 10g may have a larger size. However, compared to the conventional circuit board on which the signal and ground traces are arranged in a G-S-S-G manner, the size of the circuit board 1 of the instant embodiment is still smaller. That is to say, as long as the inner wiring layer 11 includes the inner signal traces 11s, and the first external wiring layer 10 includes the ground extending portion G1 corresponding in position to the inner signal traces 11s, the overall size of the circuit board 1 can be reduced. Furthermore, the circuit board 1 of the instant embodiment has a smaller size, but allows the electronic apparatus Z1(Z2) to have a better signal transmission quality during operation.

Beneficial Effects of the Embodiments

In conclusion, in the circuit board and the electronic apparatus provided by the present disclosure, by virtue of "the first external wiring layer 10 including a plurality of first signal traces 10s and at least one ground extending portion G1" and "an inner wiring layer 11 including a ground portion 11G and at least one inner signal trace 11s, in which the ground portion 11G has an opening region 11H, and the inner signal trace 11s is located in the opening region 11H," and "the ground extending portion G1 and the opening region 11H overlapping with each other in a thickness direction of the circuit board 1," the size of the circuit board 1 can be reduced, while reducing the signal crosstalk among the first signal traces 10s and the inner signal trace 11s. As such, a signal transmission quality of the electronic apparatus Z1, Z2 can satisfy the requirements, even much better.

To be more specific, compared to the conventional circuit board on which the signal and ground traces are arranged in a G-S-S-G manner, an area of the circuit board 1 in the embodiment of the present disclosure can be reduced by 0.64 times.

The conventional circuit board and the circuit board 1 provided in the embodiment of the present disclosure are both simulated at a transmission speed of 4266 Mbps. The simulation results show that by using the circuit board 1 provided in the embodiment of the present disclosure, the signal transmission quality of the electronic apparatus Z1(Z2) is not reduced, but much better. That is to say, by the technique features of the present disclosure, the size of the circuit board 1 can be reduced without compromising the signal transmission quality. Furthermore, by using the circuit board 1 provided in the embodiment of the present disclosure, the IC device 2 (such as a SoC chip) and the electronic device 3 (such as a dynamic random access memory) are allowed to transmit information (or data) at a higher signal transmission speed.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit board having an integrated-circuit (IC) device arrangement region and an electronic device arrangement region defined thereon and comprising:
   a first external wiring layer including a plurality of first signal traces and at least one ground extending portion that extend from the IC device arrangement region to the electronic device arrangement region; and
   an inner wiring layer including a ground portion and at least one inner signal trace, wherein the ground portion has an opening region, and the inner signal trace is located in the opening region and extends from a position under the IC device arrangement region to another position under the electronic device arrangement region;
   wherein the ground extending portion and the opening region overlap with each other in a thickness direction of the circuit board.

2. The circuit board according to claim 1, further comprising a second external wiring layer, wherein the first external wiring layer and the second external wiring layer are respectively located at two opposite sides of the circuit board, and the inner wiring layer is embedded in the circuit board and located between the first and second external wiring layers.

3. The circuit board according to claim 1, wherein the plurality of first signal traces overlap with the ground portion in the thickness direction of the circuit board.

4. The circuit board according to claim 1, wherein the ground extending portion has a width greater than a line width of each one of the plurality of first signal traces.

5. The circuit board according to claim 1, wherein the first signal traces are divided into a first group and a second group, and the ground extending portion is located between the first group and the second group.

6. The circuit board according to claim 5, wherein a quantity of the first signal traces of the first group is different from a quantity of the first signal traces of the second group.

7. The circuit board according to claim 1, wherein the first external wiring layer further includes:
   a first ground trace arranged next to the first signal traces and extending from the IC device arrangement region to the electronic device arrangement region, wherein one or more of the plurality of first signal traces are located between the ground extending portion and the first ground trace, the ground extending portion has a width larger than a line width of the first ground trace, and the first ground trace and the opening region do not overlap with each other in the thickness direction.

8. The circuit board according to claim 7, further comprising: a plurality of ground conductive posts extending from different positions of the first ground trace, respectively, to the ground portion of the inner wiring layer.

9. The circuit board according to claim 1, further comprising:
   an insulating layer disposed between the first external wiring layer and the inner wiring layer; and
   two signal conductive posts respectively located at the IC device arrangement region and the electronic device arrangement region, wherein the two signal conductive posts pass through the insulating layer so as to connect two end portions of the at least one inner signal trace, respectively.

10. The circuit board according to claim 1, wherein the ground extending portion has a width larger than a line width of the at least one inner signal trace, and the ground extending portion overlaps with the at least one inner signal trace in the thickness direction.

11. An electronic apparatus comprising:
   the circuit board as claimed in claim 1; and
   an integrated-circuit (IC) device disposed on the circuit board and located in the IC device arrangement region;
   an electronic device disposed on the circuit board and located in the electronic device arrangement region, wherein the electronic device is electrically connected to the IC device through the circuit board.

12. The electronic apparatus according to claim 11, wherein the circuit board further includes: a second external wiring layer, wherein the first external wiring layer and the second external wiring layer are respectively located at two opposite sides of the circuit board, and the inner wiring layer is embedded in the circuit board and located between the first and second external wiring layers.

13. The electronic apparatus according to claim 11, wherein the plurality of first signal traces overlap with the ground portion in the thickness direction of the circuit board.

14. The electronic apparatus according to claim 11, wherein the ground extending portion has a width greater than a line width of each one of the plurality of first signal traces.

15. The electronic apparatus according to claim 11, wherein the first signal traces are divided into a first group and a second group, and the ground extending portion is located between the first group and the second group.

16. The electronic apparatus according to claim 15, wherein a quantity of the first signal traces of the first group is different from a quantity of the first signal traces of the second group.

17. The electronic apparatus according to claim 11, wherein the first external wiring layer further includes:
a first ground trace arranged next to the first signal traces and extending from the IC device arrangement region to the electronic device arrangement region, wherein one or more of the plurality of first signal traces are located between the ground extending portion and the first ground trace, the ground extending portion has a width larger than a line width of the first ground trace, and the first ground trace and the opening region do not overlap with each other in the thickness direction.

18. The electronic apparatus according to claim 17, wherein the circuit board further includes: a plurality of ground conductive posts extending from different positions of the first ground trace, respectively, to the ground portion of the inner wiring layer.

19. The electronic apparatus according to claim 11, wherein the circuit board further includes:
an insulating layer disposed between the first external wiring layer and the inner wiring layer; and
two signal conductive posts respectively located at the IC device arrangement region and the electronic device arrangement region, wherein the two signal conductive posts pass through the insulating layer so as to connect two end portions of the at least one inner signal trace, respectively.

20. The electronic apparatus according to claim 11, wherein the ground extending portion has a width larger than a line width of the at least one inner signal trace, and the ground extending portion overlaps with the at least one inner signal trace in the thickness direction.

* * * * *